United States Patent [19]
Höfflinger et al.

[11] Patent Number: 5,608,204
[45] Date of Patent: Mar. 4, 1997

[54] IMAGE CELL FOR AN IMAGE-RECORDER CHIP, FOR PROTECTION OF HIGH INPUT SIGNAL DYNAMICS ONTO REDUCED OUTPUT SIGNAL DYNAMICS

[75] Inventors: Bernd Höfflinger, Sindelfingen, Germany; Marc Landgraf, Folsom, Calif.; Ulrich Seger, Magstadt, Germany

[73] Assignee: Institut für Mikroelektronik Stuttgart, Stuttgart, Germany

[21] Appl. No.: 302,826

[22] PCT Filed: Mar. 23, 1993

[86] PCT No.: PCT/DE93/00267

§ 371 Date: Jun. 26, 1995

§ 102(e) Date: Jun. 26, 1995

[87] PCT Pub. No.: WO93/19489

PCT Pub. Date: Sep. 30, 1993

[30] Foreign Application Priority Data

Mar. 24, 1992 [DE] Germany .......................... 42 09 536.0

[51] Int. Cl.$^6$ .................................................. H01J 40/14
[52] U.S. Cl. .................................... 250/208.1; 250/214.1; 257/448
[58] Field of Search .......................... 250/208.1, 214 R, 250/214 LA, 214.1; 327/514, 515; 257/232, 233, 292–294, 443, 444, 448; 348/308–309, 294–297

[56] References Cited

U.S. PATENT DOCUMENTS

| | | | |
|---|---|---|---|
| 5,146,074 | 9/1992 | Kawahara et al. | 250/208.1 |
| 5,153,420 | 10/1992 | Hack et al. | 250/208.1 |

*Primary Examiner*—Que T. Le
*Attorney, Agent, or Firm*—Antonelli, Terry, Stout & Kraus, LLP

[57] ABSTRACT

Disclosed is an image-recorder chip having a multiplicity of image cells provided with field-effect transistors disposed in the form of a two dimensional array and having a readout logic. This present invention is directed to the object of projection of high input signal dynamics onto reduced output signal dynamics, and is distinguished by the arrangement of the light-sensitive element of each image cell being connected between one electrode of a first MOS transistor and gate of a second MOS transistor, and by the other electrode of the first MOS transistor being connected to the one pole of a voltage supply source.

10 Claims, 5 Drawing Sheets

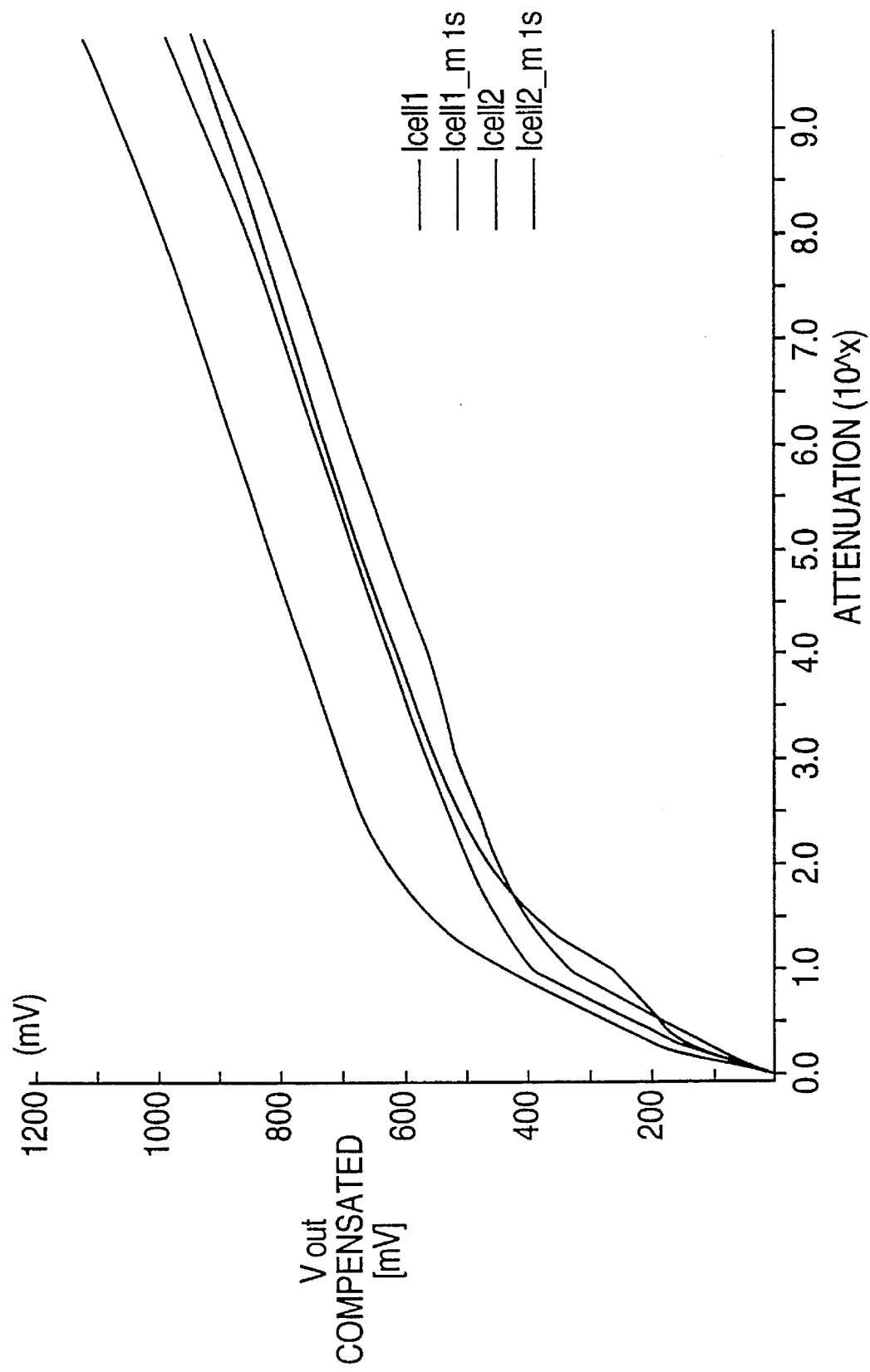

IMAGE CELL FOR AN IMAGE-RECORDER CHIP, FOR PROTECTION OF HIGH INPUT SIGNAL DYNAMICS ONTO REDUCED OUTPUT SIGNAL DYNAMICS

DESCRIPTION

1. Technical Field

The present invention relates to an image cell, in particular, for an image-recorder chip having a multiplicity of image cells disposed in the form of a two-dimensional array and having a readout logic, for the projection of high input signal dynamics onto reduced output signal dynamics Natural scenes have irradiation intensity dynamics of, in some instances, more than 1,000,000:1. In order to be able to image scenes of this type simultaneously with an image-recording system, each element of the signal processing chain, i.e. the sensor element, the readout logic, as well as, if need be, A/D converters connected thereafter for reading the image into an image-processing system, would have to have a dynamic range of 120 dB. A dynamic range of this type can be achieved with individual components, such as special semiconductor diodes or discrete A/D converters, however, elements which have a dynamic range of 120 dB are not suited for integration into a digital CMOS process. On the other hand, almost any dynamics can be achieved on the digital "side", i.e. in a subsequently connected image-processing unit with the respective hardware complexity.

2. State of the Art

An image-recorder chip whose light-sensitive elements are photo diodes or MOS transistors whose generated signals are all converted logarithmically has been proposed in U.S. Pat. No. 4,973,833. A charge coupled device (CCD) is utilized for storage and transfer of the signals from the light-sensitive elements.

The image-recorder chip known from U.S. Pat. No. 4,973,833, however, has the drawback that the input signal dynamics cannot be controlled, but rather in the case of the image recorder described in U.S. Pat. No. 4,973,833, the input signal dynamics are defined "logarithmically". Furthermore, direct and nondestructive readout of the image data is not possible.

EP 0 390 205 A2 describes an electrical circuit that is distinguished by high amplification during the conversion of the electrical charge into voltage. This circuit is predominantly employed for charge coupled devices (CCDs). In this circuit described in EP 0 390 205 A2, there is also no possibility of controlling the compression of the input signal. The amplifier circuit according to EP 0 390 205 A2 permits high amplification for small charges, however, cannot control the amplification factor and quickly reaches its limits with high charges.

U.S. Pat. No. 4,473,836 proposes an image-recorder chip in which a MOS field-effect transistor is the light-sensitive element. The gate electrode of the MOS field-effect transistor is electrically connected to a floating photo-sensitive diffusion area, yielding an image cell that projects high input signal dynamics onto reduced output signal dynamics. This cell permits further signal processing with conventional circuits produced in the same MOS process, because greatly reduced dynamic demands are made on these components.

The image-recorder chip known from U.S. Pat. No. 4,473,836 has, however, a number of drawbacks:

For one thing, the projection of the input signal dynamics onto the output signal dynamics occurs only approximately logarithmically, with the exact course of the characteristic line being greatly dependent on the fabrication parameters. The initially logarithmic characteristic line changes into a "root characteristic line". Moreover, supply voltages are needed that are imcompatible with the supply voltages of digital CMOS-VLSI circuits.

Furthermore, the known image recorders with initially logarithmic signal compression are not manufactured for array arrangement or have to be made using special processes due to the intolerance to fluctuations of the process parameters.

DESCRIPTION OF THE INVENTION

The object of the present invention is to provide an image cell, in particular, for an image sensor, which projects high input signal dynamics with a characteristic line which can be selected within a specific range and, in particular, logarithmically onto output signal dynamics.

It should be possbile to fabricate this image cell and therefore a respective image sensor with conventional CMOS technology, to integrate it with digital circuit components as well as to operate it with a single supply voltage, which is compatible with conventional digital CMOS circuits.

Furthermore, the invented image sensor should permit realization of low-noise signal amplification as well as suppression of cyclical crosstalk during readout. In addition, it should be possible to read out the picture elements with a high pixel repeat rate (>>50 Hz as is usual in HDTV applications) and to the greatest extent with random access.

A solution according to the present invention to this object is set forth in the claims.

An element of the present invention is that for projection of high input signal dynamics onto reduced output signal dynamics the light-sensitive element of each image cell is connected to the one electrode of a first MOS transistor and to the gate of a second MOS transistor. The other electrode of the first MOS transistor is connected to a pole of a supply voltage source.

It is preferable if an electrode of the first MOS transistor is the source electrode and the other electrode the drain electrode (claim 2).

The invented image cell has a characteristic line "illumination intensity, respectively irradiation intensity/output signal" which can be set within a specific range, in particular, by means of the application of a suitable control voltage to the gate electrode of the first MOS transistor. This control voltage permits controlling the compression of the input signal dynamics.

In particular, if according to claim 4 the drain electrode and the gate of the first MOS transistor are short-circuited and applied to a fixed potential, an exact logarithmic characteristic output line permitting a radiometrically unequivocal evaluation of the image data, is yielded over a range of more than seven decades.

The invented image cell has, in addition, a number of other advantages:

For instance, the image cell and thus the invented image sensor can be produced with almost any process, such as growing cell cultures as sensor elements on a passivated chip which serves as a "junction" for the derivation of potentials only via an electrode that can be contacted at the top.

Coupling Schottky diodes as sensor elements is also possible, in particular, for the infrared range. Moreover, diodes that are sensitive to electro-magnetic radiation (in particular light-sensitive diodes) may be considered as sensor elements.

In another preferred embodiment preferred for image sensors for the visible spectral range, the light-sensitive element is the one electrode of the first MOS transistor (claim 3).

Especially in this case, the invented image sensor may be realized in a standard CMOS process for digital circuits, such as a process with two metal layers and a polysilicon layer, as well as in a 2 µm n- or p-trough process or a 1.2 µm p- or n-trough process (and even smaller channel widths). The invented image sensor may then also be operated with standard CMOS supply levels.

Due to the invented arrangement, the image data can be read out without destruction of the image data. Therefore the readout logic may be designed in such a manner that it permits random access to the individual image cells (claim 9). This is especially advantageous if the recorded image is to be processed further in an image-processing device, because it often suffices to just read out a part of the image cells in order to check a scene. In this case, it is preferred if a subsequently connected image-processing device controls the readout of randomly accessible cells via a bus and the readout logic.

Furthermore, it is preferred if each individual image cell, respectively each sensor element has suitable drivers which permit triggering a parasitic capacitative load, e.g. a reading line. These drivers may, however, only be activated for accesss in order to save energy and not heat up the surroundings of the sensors, respectively to reduce thermal noise.

In the further improvement described in claim 5, the second MOS-transistor is provided as a source follower and being part of the readout amplifier for this purpose. In this case, it is preferred if the driver is designed two-stage (claim 7).

This yields a quick answering time on the (random) addressing without the sensor element being charged with a high input impedance. A suitable zero signal current during the first stage is forced by means of the circuit in such a manner that the level control of the second (power stage) ensues with adequate velocity. Compared to the conventional sensor structures, in this way arrays with considerably less current consumption can be built. Usual values are 100 mW for a 4096 pixel size array including decoder.

Moreover, even in the "worst case", i.e., an irradiation intensity of <1 µW/cm$^2$ a pixel repeat rate of 1 kHz is possible.

The further improvement described in claim 8, in which the metal layer covering the areas that are not supposed to be light sensitive is utilized as a supply line for the circuit, not only simplifies the fabrication process but also improves the voltage supply.

BRIEF DESCRIPTION OF THE DRAWING

The present invention is described in the following using preferred embodiments with reference to the drawing, to which expressly is referred with regard to the disclosure of any invented details not explained more closely herein, by way of example without the intention of limiting the scope or spirit of the overall inventive idea. Shown are in:

FIG. 3 illustrates measurement results obtained using this preferred embodiment.

DESCRIPTION OF PREFERRED EMBODIMENTS

Figure 1:
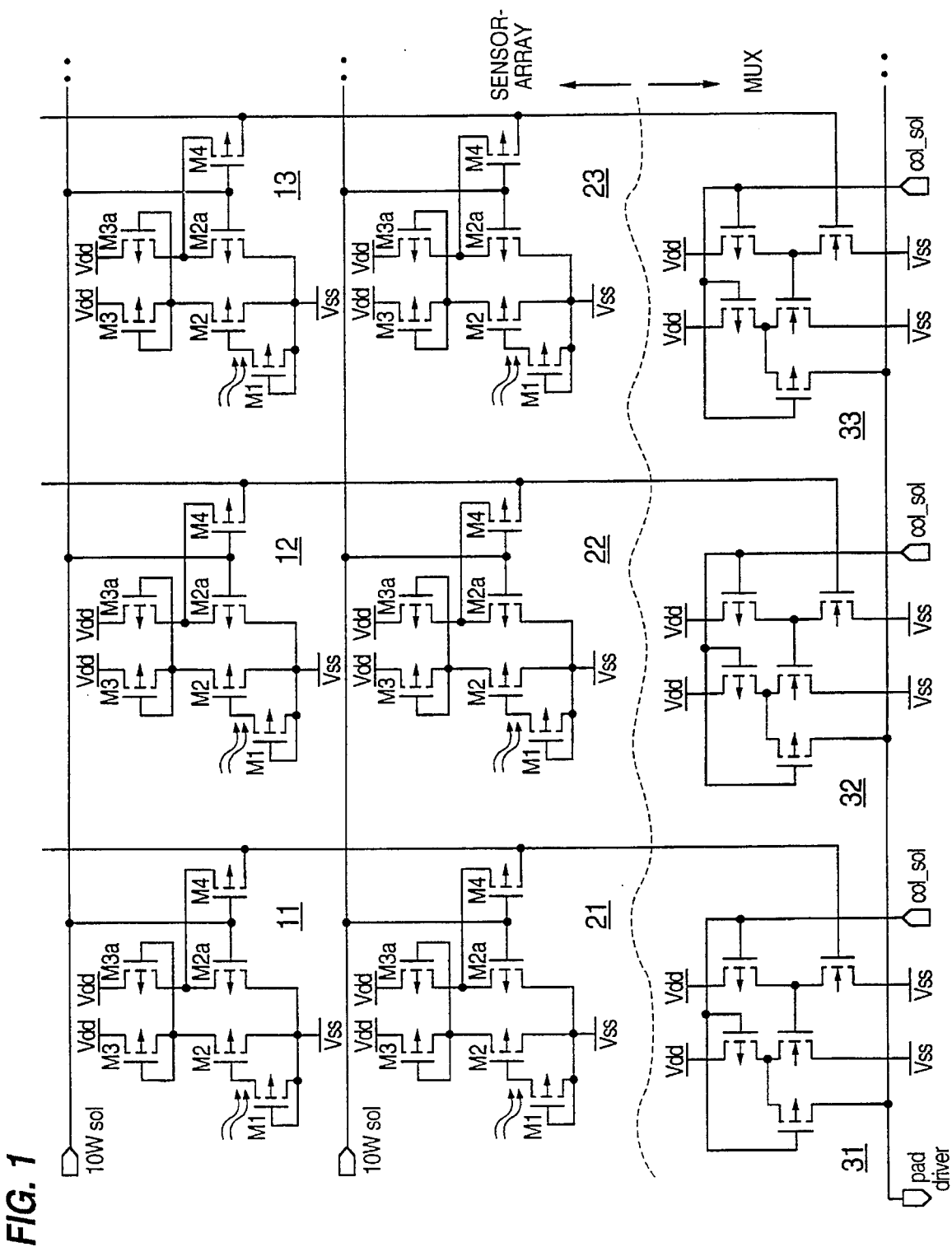
FIG. 1 illustrates a section of an invented image-recorder array.

FIG. 1 depicts a section of 2*3 image cells, respectively sensor elements 11 . . . 13, 21 . . . 23 of an image-recorder array. Shown in the lower part of FIG. 1 are analogous multipexers 31, 32 and 33 with a digital input.

In the depicted preferred embodiment, each image cell, respectively each sensor element 11 . . . 23 is composed of six MOS transistors M1, M2, M2a, M3, M3a and M4, which by way of illustration may be p-channel enhancement transistors. The light-sensitive element of each image cell 11 . . . 23 is the source electrode of the first MOS transistor M1, which is connected to the gate of the second MOS transistor M2, which is connected as a source follower. The drain electrode of the first MOS transistor M1 is connected to the one pole $V_{ss}$ of the voltage supply source, and as a result of such connection, an exact logarithmic characteristic output line permitting a radiometrically unequivocal evaluation of the image data is yielded over a range of ore than seven decodes (see FIG. 3.

The source follower M2 is utilized as part of a read-out amplifier, is utilized for impedance conversion and is integrated, with consideration to good high-frequency behavior, immediately adjacent to the sensor element, in the depicted preferred embodiment thus transistor M1.

The MOS transistor M3 serves as a "load" element, i.e. the load for the source follower M2, such load MOS transistor tapping an output voltage at the second electrode of the second MOS transistor.

Another MOS transistor M3a, also connected as a source follower, composes the second amplifier stage. MOS transistor M2a is utilized as the load for this amplifier stage, whereas output transistor M4 is connected as a power transistor. The MOS transistors M2a and M4 are switched through only during a readout procedure, in which the control line designated "row_sel" for the selection of the row to be read out is actively applied to a low potential, so that they only draw power during the readout procedure.

The selection of the column to be read out (col_sel) occurs via the analogous multiplexers 31 . . . 33, which are triggered via a digital input signal (col_sel). For the exact design of this circuit component, FIG. 1. is explicitly referred to.

The depicted circuit permits low noise amplification directly at the sensor element and adaption of the desired array area, respectively the desired read-out periods.

In the depicted circuit in FIG. 1, it is preferred if all the circuit components except for the photo-active source electrode of the MOS transistor are covered by an aluminium screen which simultaneously is utilized to supply the chip electrically ($V_{ss}$) and to stabilize the voltage supply (utilization as filter capacitor), therefore permitting greater integration density.

Figure 2:
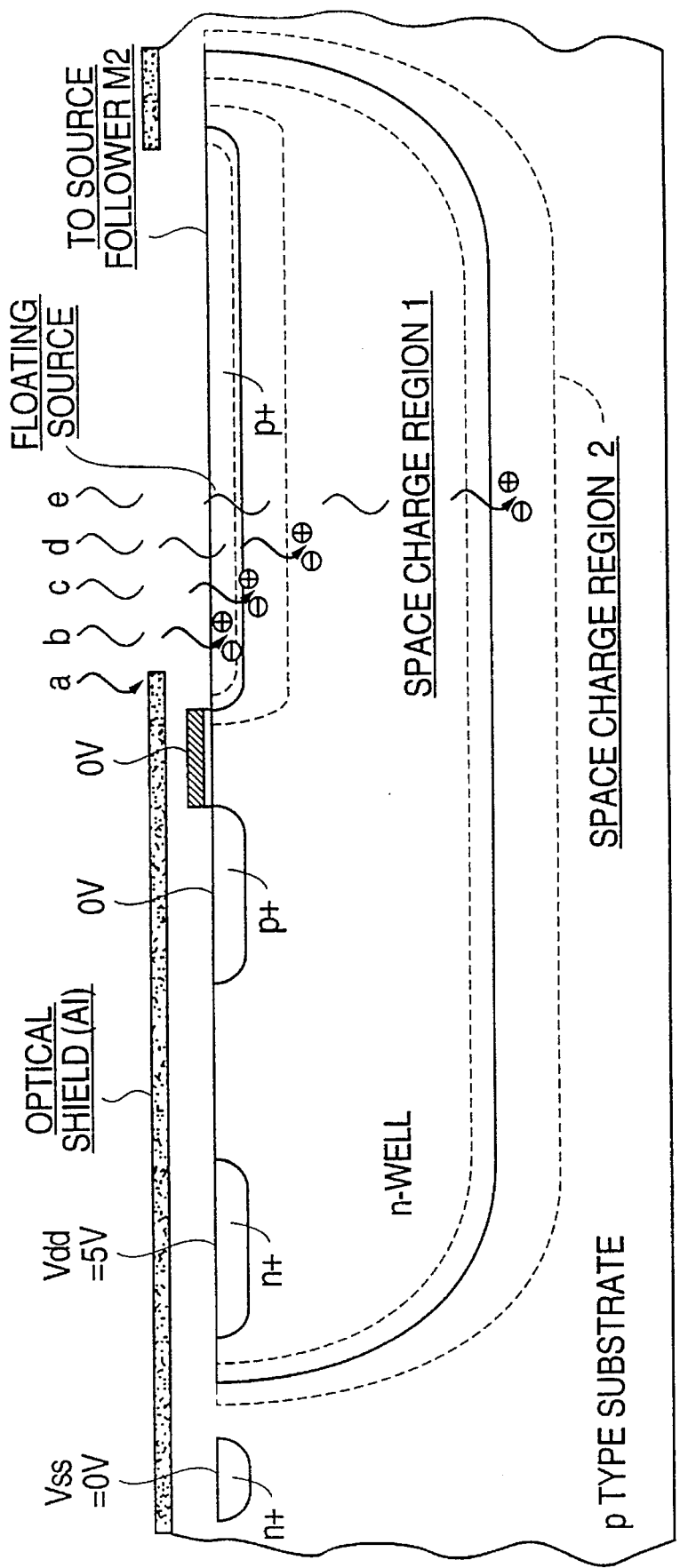
FIG. 2 illustrates a cross-section of an image cell.

FIG. 2 depicts a possible realization of an image cell 11 . . . 23. The transistors M1 to M6 are p-channel enhancement transistors in an n-trough, which is applied to a positive supply potential $V_{dd}$ (5 V), whereas the substrate beneath it is contacted to a negative supply potential $V_{ss}$ (0V).

Accordingly, an image cell exclusively of n-channel enhancement transistors in a p-trough or CMOS transistors in several troughs is, of course, also realizable but at the expense of the space factor.

As already mentioned, the actual photo-active element is the "floating source" of the MOS transistor M1, because the remaining circuit is covered by the aluminium screen A1 which prevents radiation particles impinging on it (case a in FIG. 2) from generating charge carriers in the semiconducting material.

The "floating source" collects "holes" which are generated by the action of the light in the n-trough and reach the space charge region 1 by means of diffusion or drift current (the latter only to a negligible extent) or are generated directly in the space charge region 1 (cases c and d in FIG. 2. Charges generated in the layers close to the surface of the source electrode (case b) are for the most part caught in "surface traps" and therefore hardly contribute to the generated photo current. Charges generated in the space charge region 2 can be eliminated via the trough, respectively the substrate. Only the charge carriers that are collected in the space charge region of the source electrode and are directly proportional to the absorbed light energy contribute to increasing the potential but do not lead to forming an inversion layer in the channel, because the source potential always stays under the threshold voltage as 5 V is applied to the n-trough.

Contrary to conventional, integrated photodetectors, in the image cells designed according to the present invention, the charges are eliminated by the channel in the form of "subthreshold" currents; i.e. if the eliminating transistor is correctly dimensioned, saturation cannot set in even if irradiation with visible light occurs in the <10 W/cm² range.

The "subthreshold" current, which ultimately influences the source potential, may be calculated from the following equations:

$$I_{ST} = (K_1 C_B) * (kT/q)^2 * e[q(\phi_{sS} - 2\phi_F)/kT] * (1 - e[(-qV_{DS})/kT]) \quad (1)$$

$$C_B = (K_2/[2(\phi_{sS} - V_{BS})])^{1/2} \quad (2)$$

$$\phi_{sS} = V_{GS} - V_{FB} - V_0[1 + 2(V_{GS} - V_B - V_{BS})]^{1/2} \quad (3)$$

with $K_1 = \mu_{neff} W/L$
  with $\mu_{n-eff}$=effective electron mobility
$K_2 = qK_{S\epsilon o}N_B$ with
  $K_s$=dielectric constant of Si
  $N_B$=net concentration of dopant
$C_B$=capacity of the depletion region (F/cm²)
k=Boltzmann's constant
T=Kelvin temperature
q=elementary charge
$\phi_{F2}$=Fermi potential
$\phi_{sS}$=surface potential of the source
$V_O = qK_s\epsilon_o N_B/(C_o)^2$ with
  $C_o$=area normed oxide capacity (F/cm²)
$V_{FB}$=flat band voltage
$V_{DS}$=drain source voltage
$V_{BS}$=bulk source voltage
$V_{GS}$=gate source voltage The second exponential factor in equation (1) may be ignored for $V_{DS} > kT/q$.

Due to the circuit of the sensor element depicted in FIG. 1, $V_{GS} - V_{BS}$ is independent of $V_S$; i.e., a constant. Therefore $\phi_{sS}$ in equation (3) depends directly on $V_{GS}$ and results in another constant if utilized in equation (2).

Renewed use in equation (1) shows that there is a purely exponential dependency of $V_S$ for $I_{ST}$; i.e., that the photocurrent is proportional to the logarithm of the source voltage and therefore proportional to the irradiated light power. In the hitherto known similar structures (1), the connection of the source to the gate results in additional square-root dependency in equations (2) and (3).

FIG. 3 depicts the dependency of the output voltage in mV as the function of the irradiation intensity, with it being plotted on the abscissa in arbitrary units of $10^x$. FIG. 3 shows that an exact lin-log conversion occurs over a range of seven decades.

Figure 4A:
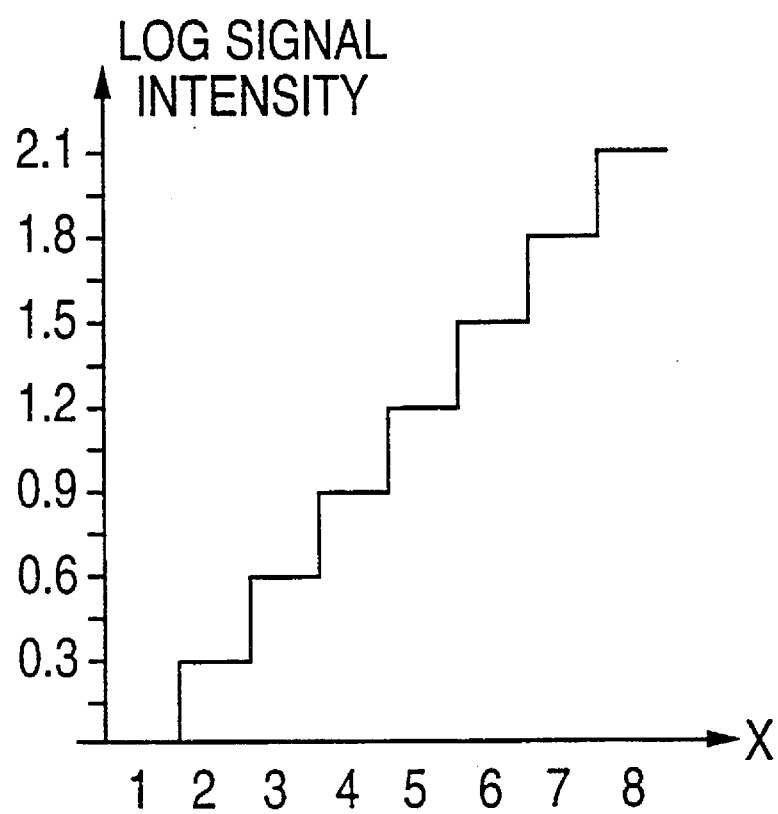
FIGS. 4a –4d illustrate a comparison of an invented sensor with a conventional sensor with "linear sensitivity".

FIG. 4a shows the output signal of an invented image cell as the function of the illumination intensity plotted on the abscissa. The intensity of the light incident on the image cell doubles with each step in x-direction. The corresponding output signal of the image cell having the logarithmic characteristic line is plotted on the y-axis in arbitrary units.

Figure 4B:
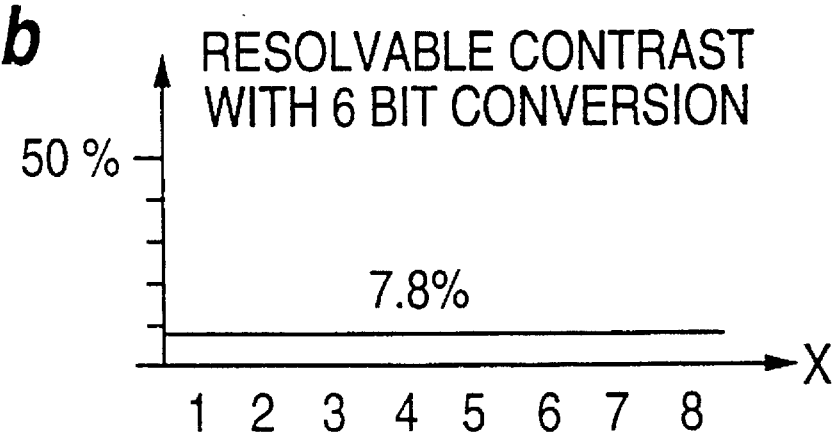
Figure 4C:
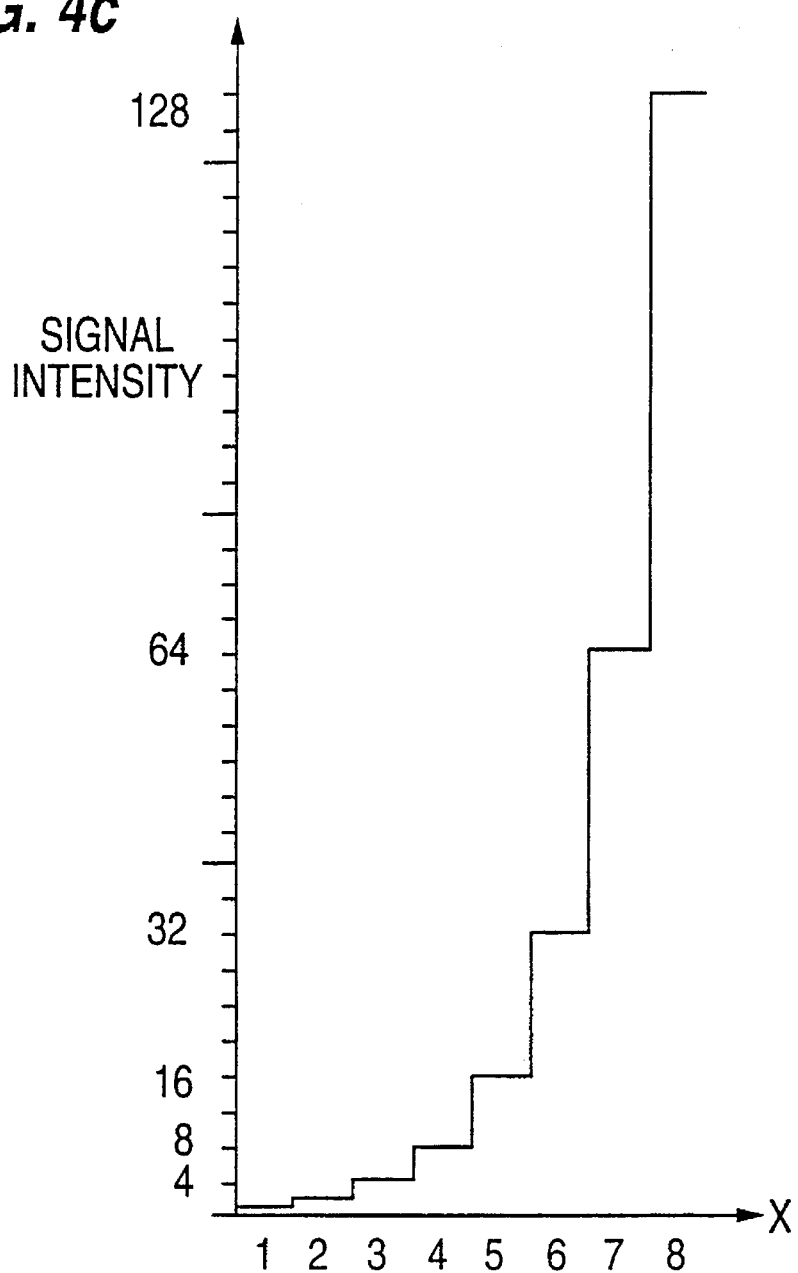

FIG. 4c shows the corresponding illustrations for a conventional image cell having a "linear sensitivity".

Figure 4D:
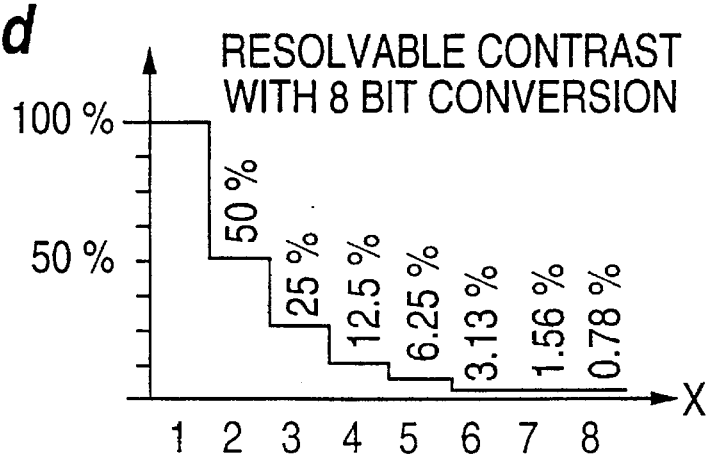

Plotted in FIGS. 4b and 4d are the resolvable contrast for the respective image cells if an A/D conversion occurs using an 8-bit A/D converter. With the invented image cell, the resolvable contrast is independent of the illumination intensity constant, whereas with conventional image cells it sinks with increasing intensity and recedes to lower values.

The invented image cells, respectively sensor elements permit exact logarithmic compression of light signals and are suitable, therefore in particular, for the projection of highly dynamic light signals. The integration of sensor elements and readout amplifiers in an image cell that can be processed in standard CMOS processes (suitable for p-troughs as well as n-troughs) qualifies this image sensor cell for building XY-image sensors with integrated digital image processing.

However, the invented image cell is also suitable as a "stand alone element", by way of illustration as a light-sensitive element for use in repeaters for lightwave conductors.

What is claimed is:

1. An image cell having field-effect transistors, providing a light-sensitive element in particular, for an image-recorder chip comprising a multiplicity of such image cells disposed in form of a two-dimensional array and a readout logic, for transference of high input signal dynamics onto reduced output signal dynamics, wherein the light-sensitive element of the image cell (11 . . . 23) being connected between one electrode of a first MOS transistor (M1) and the gate of a second MOS transistor (M2), a control voltage is applied to the gate of said first MOS transistor (M1) by which a compression of said input signal dynamics is controlled, another electrode of said first MOS transistor (M1) is connected to one polarity side ($V_{ss}$) of a voltage supply source, and an output signal being tapped at a second electrode of said second MOS transistor (2) by a control voltage by means of which the compression of said input signal dynamics can be controlled being applied to the gate of said first MOS transistor (M1), by the other electrode of said first MOS transistor (M1) being connected to the one pole ($V_{ss}$) of a voltage supply source, and by the output signal being tapped at the second electrode of said second MOS transistor (2).

2. An image cell according to claim 1,
   wherein one electrode of said first MOS transistor (M1) being the source electrode and the other electrode being the drain electrode.

3. An image cell according to claim 1 or 2,
wherein said light-sensitive element being the one electrode of said first MOS transistor (M1).

4. An image cell according to claim 1,
wherein a drain electrode and said gate of said first MOS transistor (M1) being short-circuited and applied to a fixed potential ($V_{ss}$) so that a logarithmic characteristic line is yielded.

5. An image cell according to claim 1,
wherein said second MOS transistor (M2) being connected as a source follower and being a part of a first readout amplifier.

6. An image cell according to claim 5,
further comprising a two-stage designed second readout amplifier (M3a, M4), being connected with said readout amplifier, wherein a first stage of said two-stage designed Second readout amplifier (M3a, M4) picks up little quiescent current during non-readout and a second stage (M4) is designed as a power stage which only becomes active for readout.

7. An image cell according to claim 5 or 6,
further comprising a MOS transistor (M2a, M3) serving as a load for said source follower.

8. An image cell according to claim 1, further comprising a metal layer (A1) covering the regions which are not light-sensitive and being utilized as a power supply line.

9. An image-recorder chip having image cells according to claim 1,
further comprising a readout logic (row_sel, 31 . . . 33) permitting random access to the individual image cells (11 . . . 23).

10. An image cell comprising field-effect transistors, providing a light-sensitive element in particular, for an image-recorder chip comprising a multiplicity of such image cells disposed in form of a two-dimensional array and a readout logic, for the transformation of high input-signal dynamics to reduced output-signal dynamics, wherein the light-sensitive element of each image cell (11 . . . 23) is connected between one electrode of a first MOS transistor (M1) and a gate of a second MOS transistor (M2), a control voltage is applied to a gate of said first MOS transistor in order to control compression of said input signal dynamics, the other electrode of said first MOS transistor is connected to one polarity side ($V_{ss}$, if M1 is a PMOS transistor) of a voltage supply source, and an output signal is tapped at one electrode of said second MOS transistor (M2), while its other electrode is connected to one polarity side ($V_{ss}$, if M2 is a PMOS transistor) of a voltage supply source.

* * * * *